(12) United States Patent
Marwah et al.

(10) Patent No.: US 8,352,085 B2
(45) Date of Patent: Jan. 8, 2013

(54) DISTRIBUTION OF COOLING RESOURCES USING HIERARCHICALLY IDENTIFIED COOLING MICROGRIDS

(75) Inventors: Manish Marwah, Mountain View, CA (US); Ratnesh Kumar Sharma, Fremont, CA (US); Amip J. Shah, Santa Clara, CA (US); Thomas W. Christian, Fort Collins, CO (US); Cullen E. Bash, Los Gatos, CA (US); Zhikui Wang, Fremont, CA (US); Chandrakant Patel, Fremont, CA (US)

(73) Assignee: Hewlett-Packard Development Company L.P., Houston, TX (US)

( * ) Notice: Subject to any disclaimer, the term of this patent is extended or adjusted under 35 U.S.C. 154(b) by 324 days.

(21) Appl. No.: 12/770,186

(22) Filed: Apr. 29, 2010

(65) Prior Publication Data

US 2011/0270464 A1 Nov. 3, 2011

(51) Int. Cl.
*G05D 23/00* (2006.01)
(52) U.S. Cl. ............ 700/277; 700/19; 700/20; 700/278; 700/300
(58) Field of Classification Search .................. 700/300, 700/19, 20, 277, 278
See application file for complete search history.

(56) References Cited

U.S. PATENT DOCUMENTS 6,868,682 B2 * 3/2005 Sharma et al. .................. 62/180
6,882,904 B1 * 4/2005 Petrie et al. ................... 700/295

OTHER PUBLICATIONS

Moore et al., "Making Scheduling Cool: Temperature-Aware Workload Placement in Data Centers", USENIX Annual Technical Conference, 2005.*

* cited by examiner

*Primary Examiner* — Carlos Ortiz Rodriguez (57) ABSTRACT

In a method for distributing cooling resources to a plurality of locations using a plurality of hierarchically identified cooling microgrids, conditions detected at the plurality of locations are received. Each level of the hierarchically identified cooling microgrids is a plurality of resource actuators configured to vary distribution of the cooling resources. Settings for the plurality of resource actuators in each of the levels in the cooling microgrid hierarchy that substantially maintain conditions at the plurality of locations within predetermined ranges are determined using a processor, while substantially optimizing at least one measure of performance associated with supplying the cooling resources to the plurality of locations.

18 Claims, 7 Drawing Sheets

DISTRIBUTION OF COOLING RESOURCES USING HIERARCHICALLY IDENTIFIED COOLING MICROGRIDS

CROSS REFERENCE TO RELATED APPLICATION

The present application is related to and shares some common disclosure with commonly assigned and co-pending U.S. patent application Ser. No. 12/632,682, filed on Dec. 8, 2009 by Ratnesh Kumar Sharma et al., and entitled "Determining Operational Settings for Fluid Moving Devices", the disclosure of which is hereby incorporated by reference in its entirety.

BACKGROUND

Data centers have become a ubiquitous element of modern IT infrastructure, especially in the services sector that requires "always-on" capability. Practically every large IT organization hosts a data center, either in-house or outsourced to major vendors. Furthermore, the recent emergence of the software as a service (SaaS) paradigm or more generically, cloud computing, coupled with emerging Web-based business, social networking and media applications and services have led to a tremendous growth in the number, size, and power densities of data centers. This increase has also been accompanied by equally tremendous increases in the amount of power required to operate cooling infrastructures of the data centers, which has also resulted in increases in the carbon footprints of the cooling infrastructures.

Conventional data centers use up to 50% of the total energy consumed for cooling the conventional data center. However, although there are multiple point cooling solutions available for different components of a conventional data center, the point cooling solutions are typically applied independently of each other and their inter-relationships are not exploited to improve the energy consumption of the conventional data center. The conventional data center is not organized or operated to improve an overall coefficient of performance (COP) of the cooling infrastructure.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a method and a system for distributing cooling resources to a plurality of locations using a plurality of hierarchically identified cooling microgrids, in which each level of the hierarchically identified cooling microgrids includes a plurality of resource actuators configured to vary distribution of the cooling resources. In addition, or alternatively, to defining the hierarchy of the cooling microgrids based upon physical locations of the resource actuators, the hierarchy of the cooling microgrids may be defined in terms of the level of heat exchange being performed in the cooling microgrids. In this example, for instance, the microgrids that perform greater levels of heat exchange may be at a higher level in the hierarchy as compared with microgrids that perform lesser levels of heat exchange. In addition, or alternatively, to the manners discussed above for defining the hierarchy, the hierarchy of the cooling microgrids may be constructed based upon control and/or monitoring requirements. In this example, those microgrids sharing common control systems may be considered as being in a common hierarchy level.

In the method and system disclosed herein, conditions detected at the plurality of locations are received and settings for the plurality of resource actuators in each of the levels in the cooling microgrid hierarchy are determined using a processor. Each of these settings substantially maintains conditions at the plurality of locations within predetermined ranges, while substantially optimizing at least one measure of performance associated with supplying the cooling resources to the plurality of locations.

Through implementation of the method and system disclosed herein there are several advantages to a data center. According to a particular example, hierarchical organization of the data center cooling infrastructure allows more efficient (based on ensemble coefficient of performance (COP)) sharing of cooling resources. In addition, the method and system disclosed herein provide a framework for integration and characterization of distributed cooling resources in the data center. Moreover, cooling objectives may be delegated to various levels of the cooling microgrids, which allows optimum utilization of the cooling infrastructure with reduced redundancies. Furthermore, thermal management issues get addressed closer to source, thus reducing exergy destruction and improving second law of thermodynamics efficiency.

Figure 1:
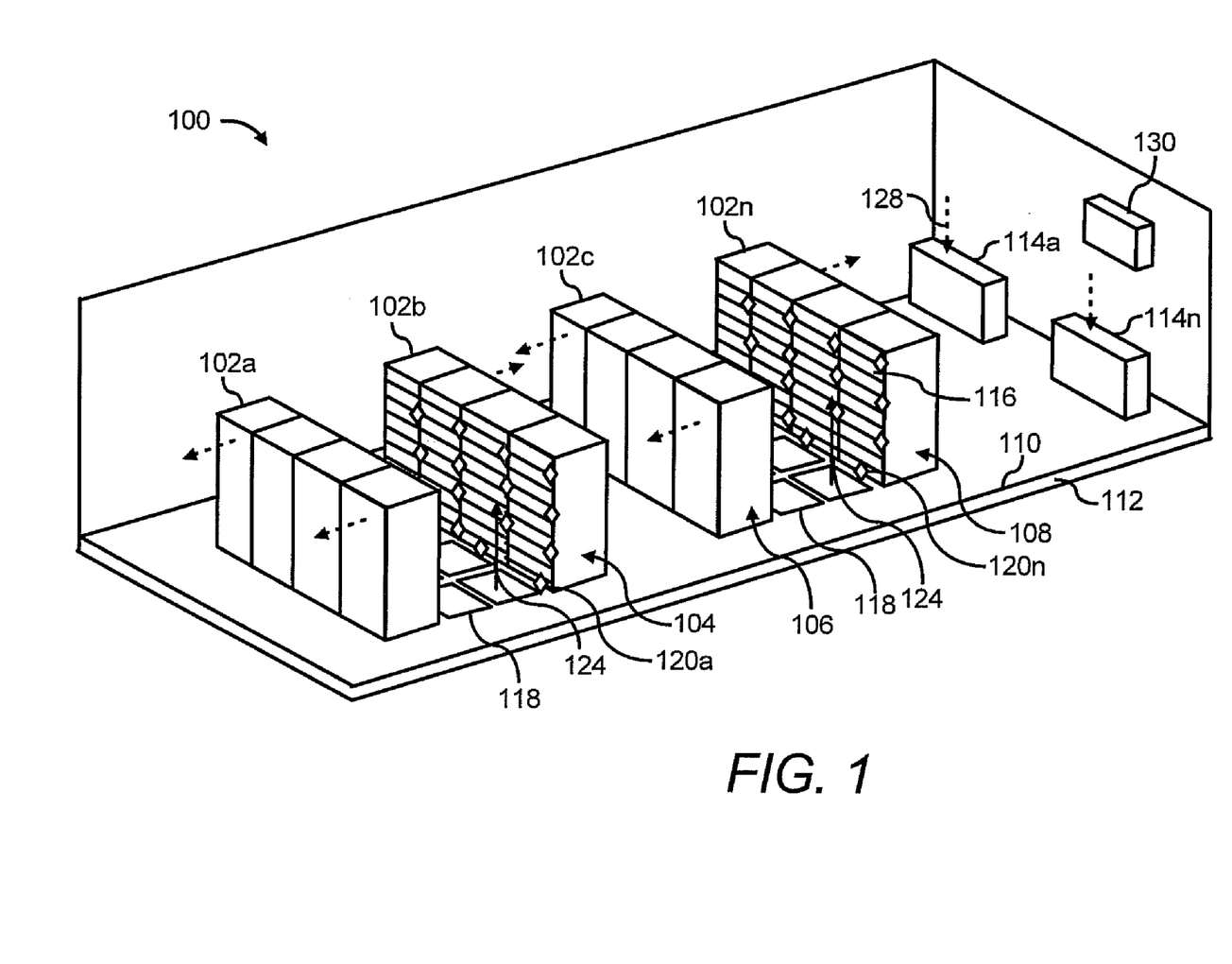
FIG. 1 shows a simplified perspective view of a section of an infrastructure, in this instance, a data center, in which a method and analyzer for determining operational settings for a plurality of fluid moving devices disclosed herein may be implemented, according to an embodiment of the invention.

With reference first to FIG. 1, there is shown a simplified perspective view of a section of an infrastructure 100, in this instance, a data center, in which a method and system for distributing cooling resources to a plurality of locations using a plurality of hierarchically identified cooling microgrids disclosed herein may be implemented, according to an example.

It should be understood that the infrastructure 100 may include additional elements and that some of the elements described herein may be removed and/or modified without departing from a scope of the infrastructure 100.

The infrastructure 100 is depicted as having a plurality of racks 102a-102n arranged in rows 104, 106, 108, a plurality of fluid moving devices 114a-114n, a plurality of sensors 120a-120n, and an analyzer 130. The racks 102a-102n are positioned on a raised floor 110 and house electronic devices 116 capable of generating/dissipating heat, for instance, computers, servers, bladed servers, disk drives, displays, etc. As shown in FIG. 1, when the fluid comprises a gas, such as air or a gaseous refrigerant, the fluid is delivered through fluid delivery devices 118 in the floor 110 to the racks 102a-102n, as denoted by the arrows 124. In other instances in which the fluid comprises a liquid, such as water, a liquid refrigerant, a multi-state refrigerant, etc., the fluid may be delivered to the racks 102a-102n through a series of pipes (not shown). The fluid moving devices 114a-114n generally operate to supply fluid flow to a space 112 beneath the raised floor 110, and in certain instances to cool heated fluid (indicated by the arrows 128).

The fluid moving devices 114a-114n may comprise widely available, conventional air conditioning (AC) units, such as, water cooled air handling units (AHUs), air cooled AHUs, etc. In any regard, the fluid moving devices 114a-114n consume relatively large amounts of energy in cooling heated fluid flow received from the infrastructure 100 and/or airflow from outside of the infrastructure 100 and in supplying the racks 102a-102n with the cooled fluid flow. In any regard, the cooled fluid contained in the space 112 may include cooled fluid supplied by one or more fluid moving devices 114a-114n, and in certain instances, fluid flow recirculated into the space 112. Thus, characteristics of the cooled fluid, such as, temperature, pressure, humidity, flow rate, etc., delivered to various locations in the infrastructure 100 may substantially be affected by the operations of a plurality of the fluid moving devices 114a-114n. As such, determining how the fluid moving devices 114a-114n are to be efficiently operated to maintain desired conditions in the infrastructure 100 is a relatively complex problem.

Various manners in which the operational settings for the fluid moving devices 114a-114n may be determined to enable the fluid moving devices 114a-114n to be operated to distribute cooling resources to a plurality of locations using a plurality of hierarchically identified cooling microgrids are discussed in greater detail herein below.

Figure 2A:
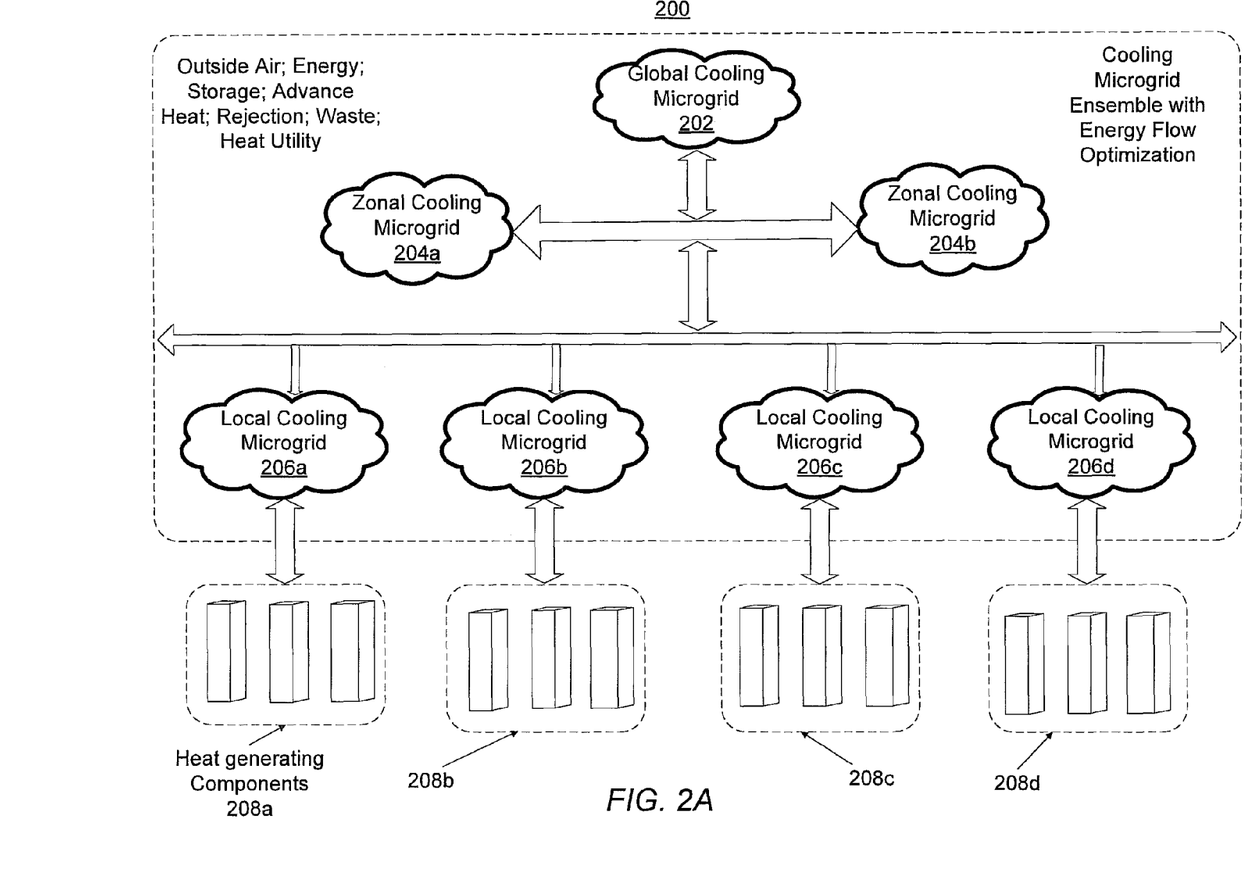
FIG. 2A shows an architecture of a system for distributing cooling resources using a plurality of hierarchically identified cooling microgrids, according to an embodiment of the invention.

With reference now to FIG. 2A, there is shown an architecture of a system 200 for distributing cooling resources to a plurality of locations in an infrastructure, such as the infrastructure 100 depicted in FIG. 1, using a plurality of hierarchically identified cooling microgrids 202-206, according to an example. It should be understood that the following description of the system 200 is but one manner of a variety of different manners in which such a system 200 may be configured. In addition, it should be understood that the system 200 may include additional elements and that some of the elements described herein may be removed and/or modified without departing from a scope of the system 200. For instance, the system 200 may include any number of sensors, memories, processors, fluid moving devices, etc., as well as other components, which may be implemented in the operations of the system 200.

As shown in FIG. 2A, the system 200 includes the plurality of hierarchically identified cooling microgrids 202-206 to cool a plurality of heat generating components 208a-208d. Generally speaking, a cooling microgrid comprises a multitude of potentially disparate local cooling resources with varying capacities and characteristics. In addition, the cooling microgrid includes a number of resource actuators that are able to vary distribution of the cooling resources at different hierarchical levels. Thus, similarly to an electrical microgrid, the cooling microgrid enables control of the cooling resource distribution at microgrid levels instead of only at a global scale. In one regard, the resource actuators in each of the microgrid hierarchy levels are able to be controlled to thereby vary the distribution of cooling resources to the microgrids over which the resource actuators have control. As discussed in greater detail herein below, the resource actuators may be operated in various manners to distribute the cooling resources while substantially maximizing operational efficiency based upon conditions detected at a plurality of locations using a plurality of sensors, such as the plurality of sensors 120a-120n depicted in FIG. 1.

As shown in FIG. 2A, the hierarchy of microgrids includes a global level cooling microgrid 202, zonal level cooling microgrids 204a, 204b, and local cooling microgrids 206a-206d. Although particular numbers of the cooling microgrids 202-206 have been depicted in FIG. 2A, it should be clearly understood that the system 200 may include any number of the cooling microgrids 202-206 in each of the hierarchical levels without departing from a scope of the system 200.

In any regard, the global cooling microgrid 202 affects the cooling provisioning supplied to the zonal cooling microgrids 204a and 204b and the local cooling microgrids 206a-206d. More particularly, for instance, the global cooling microgrid 202 may function to control the temperature of cooling fluid supplied to fluid moving devices 114a-114n in the infrastructure 100 and thus, has an effect on the operations of the fluid moving devices 114a-114n. In addition, the zonal cooling microgrids 204a and 204b affect the cooling provisioning supplied to one or more of the local cooling microgrids 206a-206d. More particularly, for instance, a zonal cooling microgrid 204a may function to control the volume flow rate of air supplied to particular rows of racks 104 by the fluid moving devices 114a-114n and thus has an effect on the components contained in those rows 104. Moreover, the local cooling microgrids 206a-206d may function to control the volume flow rate of air supplied to one or more particular racks 102a-102n. The resource actuators of the local cooling microgrids 206a-206d may thus comprise the fluid delivery devices 118 depicted in FIG. 1. In addition, or alternatively, the local cooling microgrids 206a-206d may include resource actuators configured to vary cooling resource distribution at more localized levels, such as, rack-level and/or server-level fans.

Figure 2B:
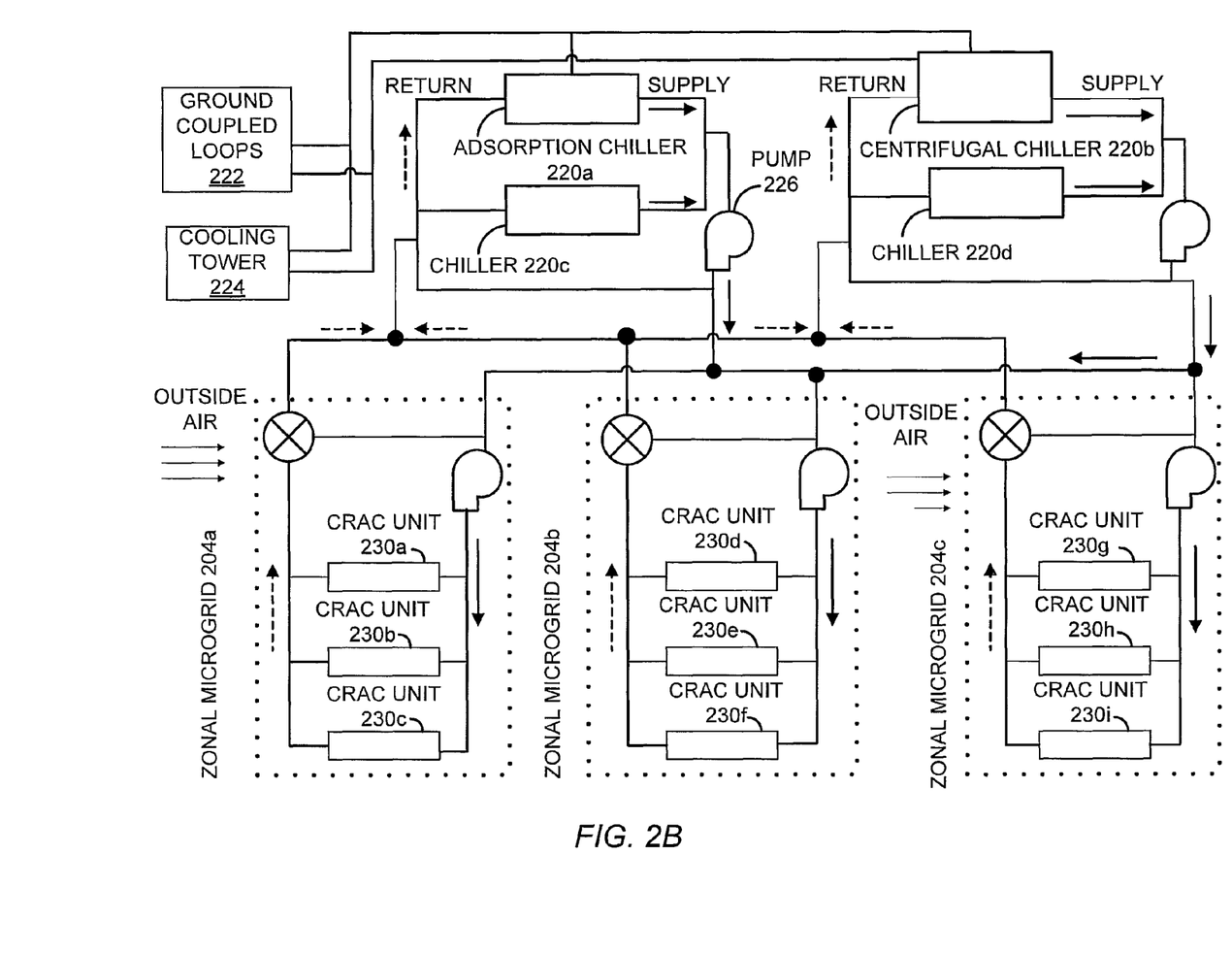
FIGS. 2B and 2C, respectively, show schematic diagrams of global and zonal level cooling resource actuators that may be employed in the system depicted in FIG. 2A, according to embodiments of the invention.

Turning now to FIG. 2B, there is shown a schematic diagram of various global level cooling resource actuators 220a-220d and zonal level cooling resource actuators, in this example, computer room air conditioning (CRAC) units 230a-230i, that may be employed in the system 200, according to an example. As shown therein, the various global level cooling resource actuators 220a-220d may comprise an adsorption chiller 220a, a centrifugal chiller 220b, or another type of conventional chiller 220c, 220d. In addition, the global level cooling resource actuators 220a-220d may receive cooled cooling fluid, such as chilled water, refrigerant, etc., from one or both of ground coupled loops 222 and a cooling tower 224. The global level cooling resource actuators 220a-220d are also depicted as receiving heated cooling fluid (represented by the dashed arrows) from the CRAC units 230a-230i. The heated cooling fluid is cooled in one or more of the global level cooling resource actuators 220a-220d and the cooled cooling fluid (represented by the solid arrows) is circulated back to the CRAC units 230a-230i through operation of one or more pumps 226.

In the CRAC units 230a-230i, the cooled cooling fluid cools air that flows through the CRAC units 230a-230i and becomes heated. The air may be airflow re-circulated within an infrastructure 100 or airflow from outside of the infrastructure 100. The process discussed above is repeated in a substantially continuous manner to continually airflow in various zones of an infrastructure 100.

Figure 2C:
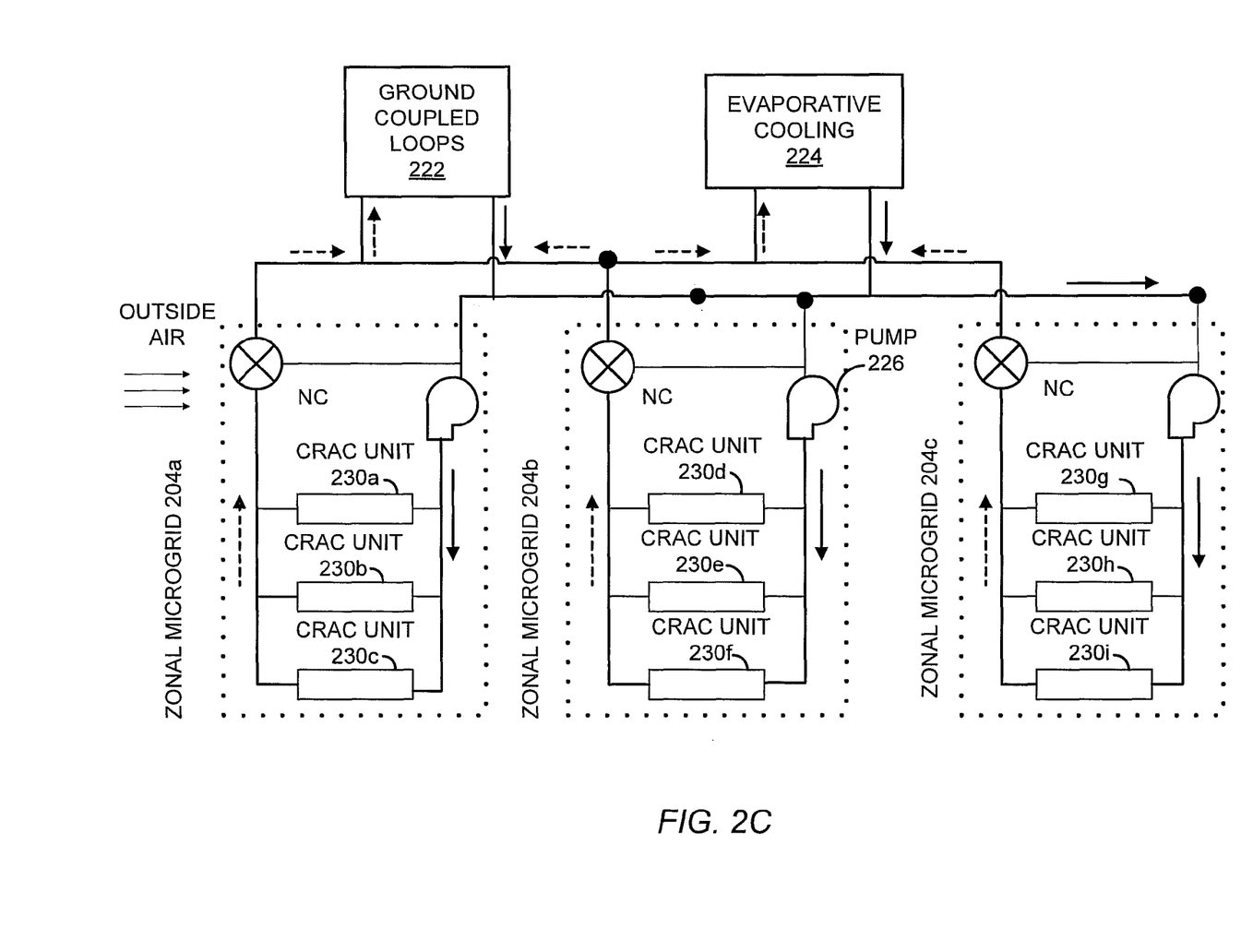

Turning now to FIG. 2C, there is shown a schematic diagram of various global level cooling resource actuators 222 and 224 and zonal level cooling resource actuators, in this example, computer room air conditioning (CRAC) units 230a-230i, that may be employed in the system 200, according to an example. FIG. 2C contains all of the elements depicted in FIG. 2B except for the chillers 220a-222d. Instead, in FIG. 2C, the heated cooling fluid is supplied directly into one or both of the ground coupled loops 222 and the evaporative cooling 224, such as a cooling tower 224, where the cooling fluid is cooled. In addition, the cooled cooling fluid is supplied back through the CRAC units 230a-230i to enable cooling to be provisioned at the zonal and global microgrid levels.

Although particular reference has been made throughout this disclosure to the cooling resource distributed at the zonal microgrid 204a, 204b and the local microgrid 206a-206d levels as comprising cooled airflow, it should be understood that the cooling resource may comprise a cooling fluid, such as, a refrigerant, chilled water, etc., without departing from a scope of the system 200. In this example, the resource actuators at the zonal microgrid 204a, 204b and the local microgrid 206a-206d levels may comprise pumps, valves, metering devices, etc. In addition, one or more of the microgrids or resource actuators may use different cooling fluids.

The heat generating components 208a-208d may comprise electronic devices capable of generating/dissipating heat, for instance, computers, servers, bladed servers, disk drives, displays, etc. The heat generating components 208a-208d may be stored in racks positioned on a raised floor (not shown) and may correspond or correlate to the plurality of locations where the cooling resources may be distributed.

Figure 3:
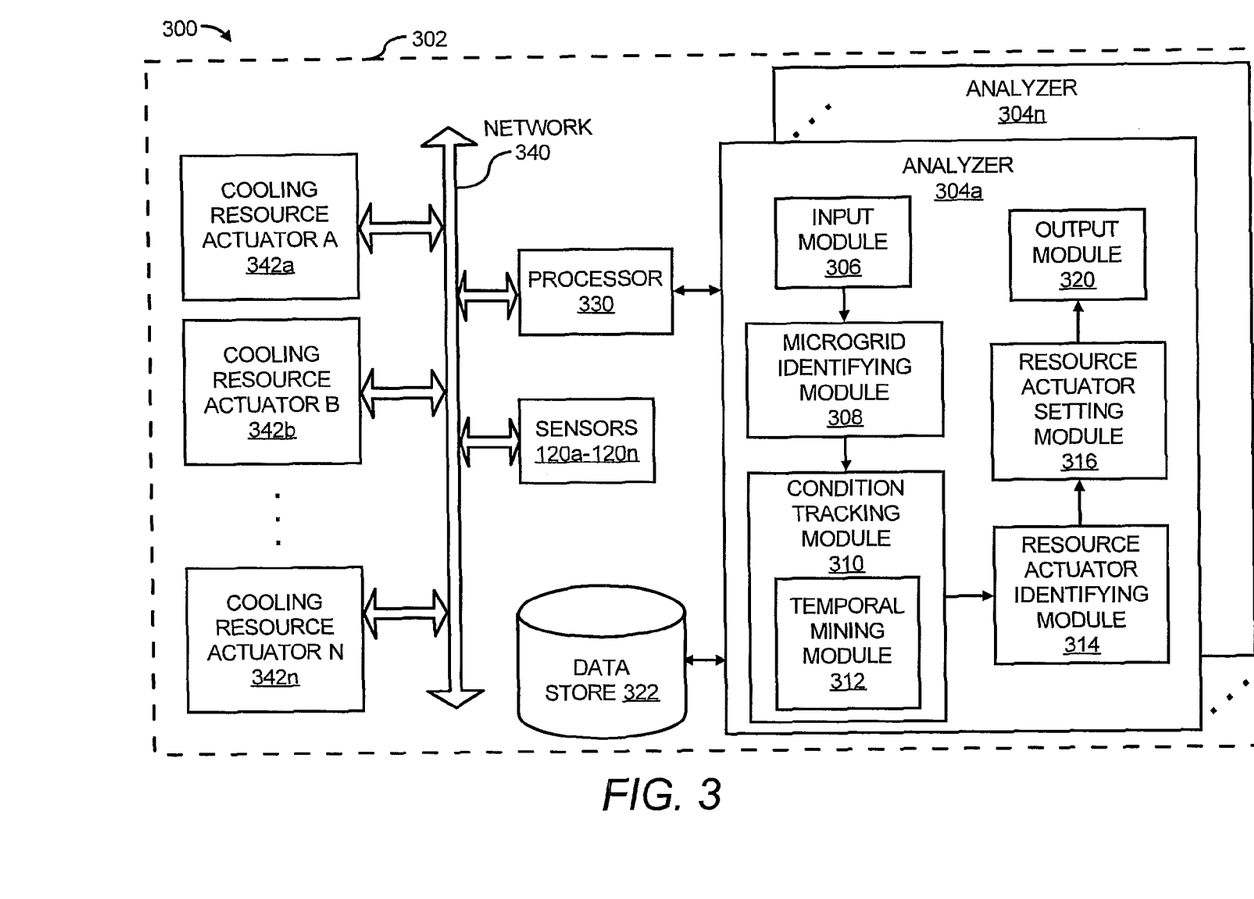
FIG. 3 shows a block diagram of a system for distributing cooling resources using a plurality of hierarchically identified cooling microgrids, according to an embodiment of the invention.

Turning now to FIG. 3, there is shown a block diagram 300 of a system 302 for distributing cooling resources to a plurality of locations using a plurality of hierarchically identified cooling microgrids, such as the plurality of hierarchically identified cooling microgrids 310 depicted in FIG. 2, according to an example. It should be understood that the following description of the block diagram 300 is but one manner of a variety of different manners in which such a system 302 may be configured. In addition, it should be understood that the system 302 may include additional components and that some of the components described herein may be removed and/or modified without departing from a scope of the system 302. For instance, the system 302 may include any number of sensors, memories, processors, fluid moving devices, etc., as well as other components, which may be implemented in the operations of the system 302.

As shown in FIG. 3, the system 302 includes a plurality of analyzers 304a-304n. According to a first embodiment, each of the analyzers 304a-304n comprises a separate analyzer 130 depicted in the infrastructure 100 of FIG. 1. According to a second embodiment, all of the analyzers 304a-304n together form the analyzer 130 depicted in the infrastructure 100 of FIG. 1. In this embodiment, although the system 302 has been depicted as including multiple analyzers 304a-304n, the analyzers 304a-304n may be replaced with a single analyzer 304a without departing from a scope of the system 302.

The analyzers 304a-304n are each depicted as including an input module 306, a microgrid identifying module 308, a condition tracking module 310, a temporal mining module 312, a resource actuator identifying module 314, a resource actuator setting module 316, and an output module 320. According to an example, the each of the analyzers 304a-304n comprises software stored, for instance, in volatile or non-volatile memory, such as DRAM, EEPROM, MRAM, flash memory, floppy disk, a CD-ROM, a DVD-ROM, or other optical or magnetic media, and the like. In this example, the modules 306-320 comprise software modules stored in the memory, which are executable by a processor 330 of a computing device. According to another example, the analyzers 304a-304n comprise one or more hardware devices, such as, circuits arranged on one or more boards. In this example, the modules 306-320 comprise circuit components or individual circuits, which may also be controlled by a processor of a computing device. According to a further example, the analyzer 304 comprises a combination of hardware and software modules.

Generally speaking, one or more of the analyzers 304a-304n are configured to determine settings for a plurality of resource actuators 342a-342n belonging to different levels of a plurality of hierarchically identified microgrids that substantially maintain conditions at a plurality of locations in one or more infrastructures 100 within predetermined ranges. In addition, the one or more analyzers 304a-304n are configured to determine the settings while substantially optimizing at least one measure of performance associated with supplying cooling resources to the plurality of locations. The cooling resource actuators 342a-342n may comprise any of the resource actuators discussed above, including, for instance, fluid moving devices 114a-114n, fluid delivery devices 118, chillers 220a-220d, ground coupled loops 222, cooling tower 224, pumps 226, etc. According to an embodiment, each of the one or more analyzers 304a-304n is configured to determine the settings for a microgrid of actuators 342a-342n, for instance, based upon hierarchy levels. According to another embodiment, a single analyzer 304a is configured to determine the settings for multiple microgrids of actuators 342a-342n across multiple hierarchical levels.

According to an example, the one or more analyzers 304a-304n are configured to determine the operational settings based upon information received from a plurality of sensors 120a-120n. In this example, the plurality of sensors 120a-120n may comprise sensors configured to detect, for instance, temperature levels, power consumption levels, operating levels, etc. The one or more analyzers 304a-304n may receive the information over a network 340 that operates to couple the various components of the system 302 or from a data storage location where the information is stored prior to retrieval by the one or more analyzers 304a-304n. The network 340 generally represents a wired or wireless structure in the infrastructure for the transmission of data between the various components of the system 302.

In any regard, the one or more analyzers 304a-304n are configured to store the condition information received from the sensors 120a-120n in a data store 322, which may comprise any reasonably suitable memory upon which the analyzer 304 may store data and from which the one or more analyzers 304a-304n may receive or retrieve data. Although the data store 322 has been depicted as forming a separate component from the one or more analyzers 304a-304n, it should be understood that the data store 322 may be integrated with the one or more analyzers 304a-304n without departing from a scope of the system 200.

The one or more analyzers 304a-304n may also output the determined operational settings through the output module 320. Thus, for instance, the determined operational settings may be outputted to a display upon which the outputted information may be displayed, a printer upon which the outputted information may be printed, a connection over which the outputted information may be conveyed to another computing device, a data storage device upon which the outputted information may be stored, etc.

According to a particular example where the processor 330 is configured to control operations of the cooling resource actuators 342a-342n, the processor 330 may receive the determined operational settings and may transmit instructions over the network 340 to the cooling resource actuators 342a-342n to vary operations of one or more of the cooling resource actuators 342a-342n to match the determined operational settings.

Figure 4:
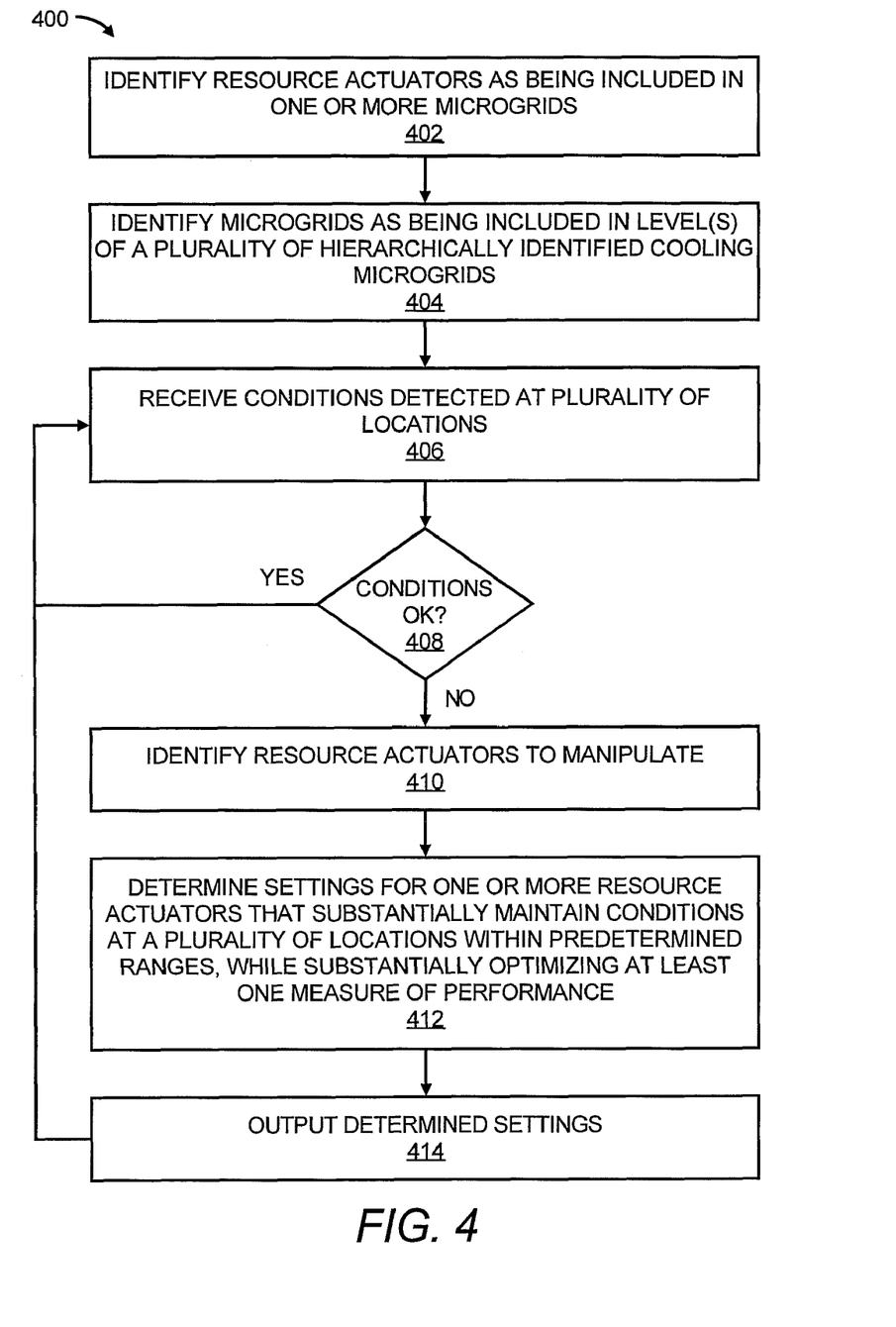
FIG. 4 shows a flow diagram of a method for distributing cooling resources to a plurality of locations using a plurality of hierarchically identified cooling microgrids, according to an embodiment of the invention.

Various manners in which the system 300 may operate are discussed with respect to the method 400 depicted in FIG. 4. More particularly, FIG. 4 depicts a flow diagram of a method 400 for distributing cooling resources to a plurality of locations using a plurality of hierarchically identified cooling microgrids, according to an example. It should be apparent to those of ordinary skill in the art that the method discussed below with respect to FIG. 4 represents a generalized illustration and that other steps may be added or existing steps may be removed, modified or rearranged without departing from the scope of the method 400.

Although particular reference is made to the system 300 depicted in FIG. 3 as performing the steps outlined in the method 400, it should be understood that the method 400 may be performed by a differently configured system without departing from a scope of the method 400. In addition, although particular reference is made to the modules of a single analyzer 304a as performing the steps in the method 400, it should be understood that one or more of the steps of the method 400 may be performed by modules of multiple analyzers 304a-304n.

At step 402, the resource actuators 342a-342n are identified as being included in one or more of the cooling microgrids 202-206 (FIG. 2A), for instance, by the microgrid identifying module 308. More particularly, for instance, the resource actuators 342a-342n are identified as being included in the microgrids in an infrastructure 100 over which the resource actuators 342a-342n respectively have at least a predetermined level of influence. Thus, by way of example, a fluid delivery device 118 may be considered to be in a particular aisle (local cooling microgrid 206a) of the infrastructure 100.

At step 404, the microgrids 202-206 are identified as being included in one or more levels of a plurality of hierarchically identified cooling microgrids 202-206, for instance, by the microgrid identifying module 308. More particularly, for instance, the microgrids 204-206 having resource actuators 342a-342n that affect the distribution of cooling resources to other resource actuators 342a-342n are identified as being in a higher level in the hierarchy than the microgrids 202 having resource actuators 342a-342n that do not affect the distribution of cooling resources to other resource actuators 342a-342n.

The hierarchical identification of the microgrids 202-206 generally allows for the thermodynamic interface of cooling resources from upper levels 202-204 of the hierarchically identified cooling microgrids to lower levels 204-206 of the hierarchically identified cooling microgrids. The hierarchically identified cooling microgrids 202-206 may also include energy storage mechanisms configured to assist in matching energy supply characteristics of the various micro-grid cooling resources with those of cooling demand. The presence of multiple hierarchical levels of control discussed herein generally allows for more granular control of actuators, for instance, even when some global data may be missing, as well as for granular control of actuators on shorter time-scales than what might occur in a scenario where only a global controller may be available. The multiple hierarchical levels of control discussed herein also assists in optimization on a global scale with improved availability and reliability as compared with conventional non-hierarchical control arrangements.

According to an example, steps 402 and 404 are considered optional because the inclusion of the resource actuators 342a-342n in the microgrids 202-206 and the hierarchical arrangement of the microgrids 202-206 may be defined prior to implementation of the method 400. For instance, the arrangement of the microgrids 202-206 may be predefined during the original design and layout of the infrastructure 100.

In any regard, at step 406, condition information is received from the sensors 120a-120n, for instance, through the input module 306. The condition information may include temperature measurements, airflow volume flow rate measurements, cooling fluid flow rate measurements, pressure measurements, workload/utilization measurements, etc, detected at various locations within one or more infrastructures 100. In addition, as discussed above with respect to the system 300 in FIG. 3, the processor 330 may receive the detected conditions directly from the sensors 120a-120n or from a data storage location in which the conditions have previously been collected and stored. Moreover, the received condition information may be stored in the data store 322. Additional information, such as, information pertaining to the priorities of the workloads running at various locations may also be stored in the data store 322 and the processor 330 may employ the additional information in determining the settings for the plurality of resource actuators.

At step 408, a determination as to whether the conditions detected at the various locations in the one or more infrastructures 100 are within predetermined ranges, for instance, by the condition tracking module 310. The predetermined ranges may comprise, for instance, manufacturer recommended operating temperatures for servers contained in an infrastructure, known safe operating conditions for the servers, etc. In another example, the temporal mining module 312 may be implemented to identify anomalies in the detected conditions as discussed in greater detail in copending U.S. patent application Ser. No. 12/632,682. As discussed therein, the temporal mining module 312 may use temporal data mining algorithms on the data collected from the sensors 120a-120n. For instance, the temporal mining module 312 may use continuous-valued multivariate time series data to find recurrent motifs as "frequent episodes" underlying the data. An efficient change point detection algorithm may be coupled with a temporal re-description approach to model key events of interest. Levelwise algorithms may then be used to find episodes that have sufficient support.

In the event that the conditions detected by the sensors 120a-120n are within the predetermined ranges, the analyzer 304 may continue to receive the detected conditions as indicated at step 406. However, if the condition tracking module 310 determines that one or more conditions are outside of the predetermined ranges, the one or more resource actuators 342a-342n in each of the levels in the cooling microgrid hierarchy that may be manipulated to substantially maintain conditions at the plurality of locations within predetermined ranges are identified, for instance, by the resource actuator identifying module 314, as indicated at step 410. By way of example, optimization and objective criteria may be employed in identifying the appropriate one or more resource actuators 342a-342n in the cooling microgrid hierarchy to be manipulated. The optimization and objective criteria may include those discussed below with respect to step 412. In addition, the settings for the one or more resource actuators 342a-342n in each of the levels of the cooling microgrid hierarchy that substantially maintains conditions at the plurality of locations within the predetermined ranges may be determined at step 412. Moreover, at step 412, settings for the one or more resource actuators 342a-342n that substantially optimize at least one measure of performance associated with supplying the cooling resources may also be determined, for instance, by the resource actuator setting module 316, as indicated at step 412.

According to an example, the resource actuator identifying module 314 identifies which of the one or more resource actuators 342a-342n in the hierarchy of microgrids 202-206 may be manipulated to vary the distribution of cooling resources to the location(s) identified as having conditions that are outside of the predetermined ranges. From this determination, if there is more than one resource actuator 342a-342n that may be manipulated to bring the conditions within the predetermined ranges, the resource actuator identifying module 310 determines measures of performance resulting from manipulation of the resource actuators 342a-342n and identifies the resource actuator(s) associated with the substantially optimized measure of performance as the one or more resource actuators 342a-342n to be manipulated. The resource actuator identifying module 314 may identify the resource actuator(s) 342a-342n to manipulate and determine the measures of performance through application of various analytical tools. For instance, the resource actuator identifying module 314 may implement a computational fluid dynamics (CFD) tool to predict the cooling resource distribution resulting from various resource actuator 342a-342n manipulations. As another example, the resource actuator identifying module 314 may employ models based upon historical data to predict how manipulating the resource actuator(s) 342a-342n will likely affect the cooling resource distribution in the infrastructure(s) 100.

According to an embodiment, the at least one measure of performance comprises a coefficient of performance of the cooling resource actuators 342a-342n. In this embodiment, the coefficient of performance of the cooling resource actuators 342a-342n may be adopted to create an integrated model across the different length scales in the infrastructure(s) 100. In addition, the resource actuators 342a-342n are manipulated with the goals of managing supply and demand of cooling resources while minimizing the energy cost function and maintaining reliability. Thus, for instance, the resource actuator identifying module 314 is configured to determine settings for the resource actuators 342a-342n across the hierarchy of cooling micro-grids 202-206 to maximize the coefficient of performance of the cooling resource actuators 342a-342n.

According to another embodiment, the at least one measure of performance comprises a thermoeconomic measure of performance. In this embodiment, a thermoeconomic approach relying on the second law of thermodynamics is adopted to determine the interaction between geography, meteorology, and the infrastructure 100 cooling energy demand. In addition, the resource actuators 342a-342n are manipulated with the goals of minimizing the total cost of ownership while maximizing the utilization of available energy (exergy). For instance, the selection and/or operation of the cooling resource actuators 342a-342n is optimized for delivery of cooling at the desired availability, efficiency, and emission levels. In addition, a simulation model of the infrastructure 100 may be constructed and run to identifying end-use requirements and simulate the basic thermodynamics of the infrastructure 100, for instance, to primarily simulate the cooling requirements given the waste heat load, building shell performance, weather, etc.

In any regard, at step 410, the settings for the one or more resource actuators 342a-342n identified at step 408 are determined to meet the conditions discussed above. Thus, for instance, the resource actuator setting module 316 may determine that the flow rate of a cooling resource supplied through one or more resource actuators 342a-342n at one or more hierarchical levels of microgrids 202-206 is to be increased or decreased.

At step 414, the settings for the one or more resource actuators 342a-342n determined at step 412 are outputted, for instance, by the output module 318. The determined settings may be outputted to a user, for instance, through a display, through transmission over a network, printed on a printer, etc. In another example, the determined settings may be communicated over the network 340 to the resource actuators 342a-342n. In this example, the analyzer 304 may have direct control over the operations of the resource actuators 342a-342n and the resource actuators 342a-342n may be manipulated as determined at step 414.

Some or all of the operations set forth in the method 400 may be contained as utilities, programs, or subprograms, in any desired computer accessible medium. In addition, the method 400 may be embodied by computer programs, which can exist in a variety of forms both active and inactive. For example, they may exist as software program(s) comprised of program instructions in source code, object code, executable code or other formats. Any of the above may be embodied on a computer readable storage medium.

Exemplary computer readable storage media include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above.

Figure 5:
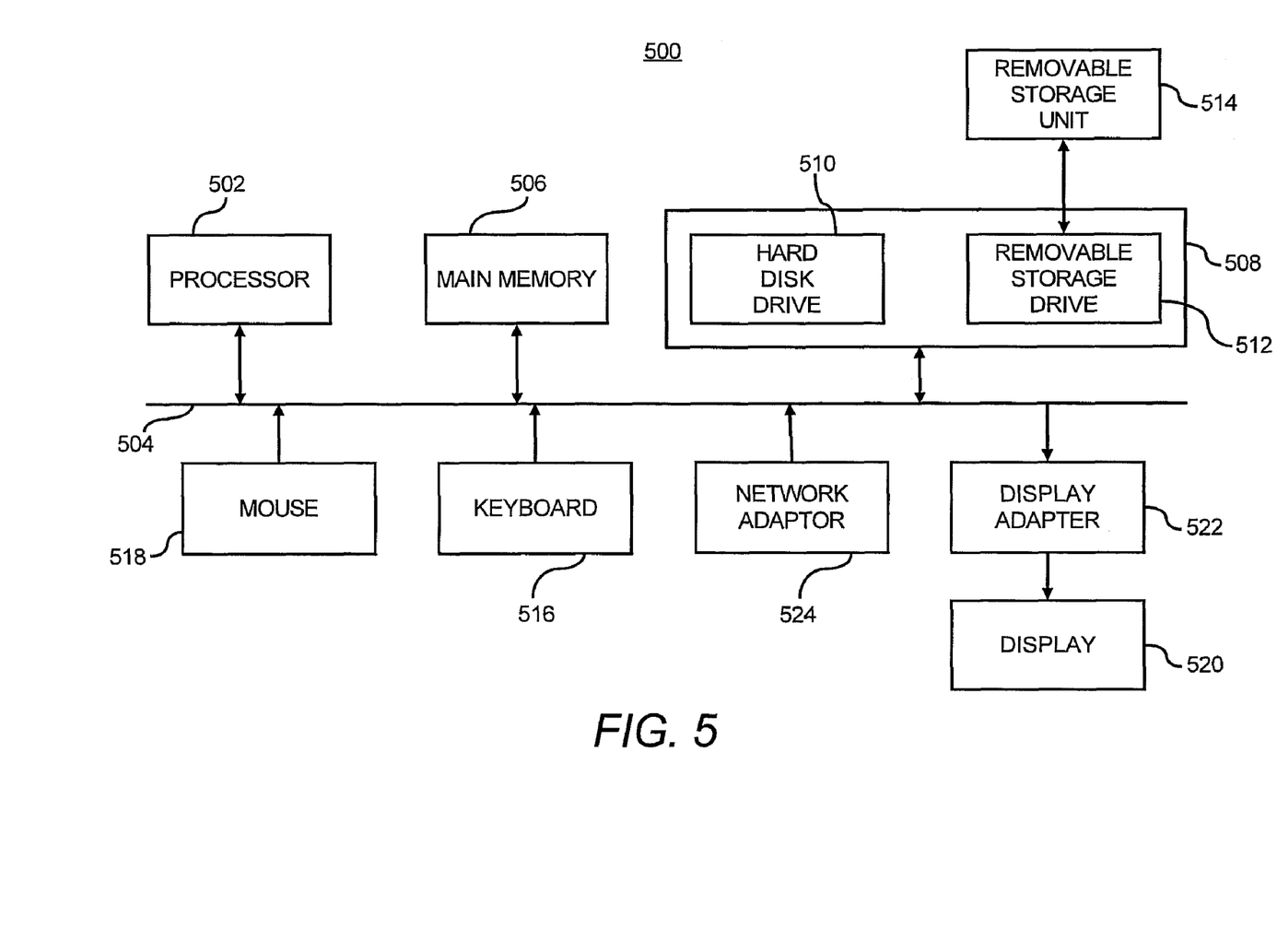
FIG. 5 illustrates a block diagram of a computing apparatus configured to implement or execute the method depicted in FIG. 4, according to an embodiment of the invention.

FIG. 5 illustrates a block diagram of a computing apparatus 500 configured to implement or execute the method 400 depicted in FIG. 4, according to an example. In this respect, the computing apparatus 500 may be used as a platform for executing one or more of the functions described hereinabove with respect to the system 300.

The computing apparatus 500 includes a processor 502 that may implement or execute some or all of the steps described in the method 400. Commands and data from the processor 502 are communicated over a communication bus 504. The computing apparatus 500 also includes a main memory 506, such as a random access memory (RAM), where the program code for the processor 502, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the method 400 may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor(s) 502 may communicate over a network, for instance, the Internet, LAN, etc., through a network adaptor 524.

It will be apparent to one of ordinary skill in the art that other known electronic components may be added or substituted in the computing apparatus 500. It should also be apparent that one or more of the components depicted in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of distributing cooling resources to a plurality of locations using a plurality of hierarchically identified cooling microgrids that comprise levels, each level of the hierarchically identified cooling microgrids comprising a plurality of resource actuators configured to vary distribution of the cooling resources, said method comprising:

receiving conditions detected at the plurality of locations; and using a processor to determine settings for the plurality of resource actuators in each level of the hierarchically identified cooling microgrids that maintain conditions at the plurality of locations within predetermined ranges;

identifying the plurality of resource actuators as being included in one or more microgrids, wherein the processor is configured to determine the settings for the plurality of resource actuators based upon the one or more microgrids into which the plurality of resource actuators are identified as being included;

optimizing at least one measure of performance associated with supplying distributed cooling resources to the plurality of locations while maintaining the conditions within the predetermined ranges, based on manipulation of the resource actuators across levels of the hierarchically identified cooling microgrids;

the manipulation performed to determine a plurality of measures of performance, and identifying an optimized measure of performance and associated settings for the plurality of resource actuators;

wherein the at least one measure of performance comprises a coefficient of performance of the distributed cooling resources and wherein using the processor to determine settings for the plurality of resource actuators further comprises using the processor to determine settings to maximize the coefficient of performance of the distributed cooling resources.

2. The method according to claim 1, further comprising: in each level of the hierarchically identified cooling microgrids, identifying the plurality of resource actuators as being included in one or more microgrids.

3. The method according to claim 2, further comprising:
identifying the microgrids as being included in one or more levels of the plurality of hierarchically identified cooling microgrids.

4. The method according to claim 3, wherein identifying the microgrids further comprises:

identifying a plurality of resource actuators as a global level of resource actuators being included in a global level of the hierarchically identified cooling microgrids;

identifying a plurality of resource actuators as a zonal level of resource actuators being included in a zonal level of the hierarchically identified cooling microgrids, wherein the zonal level of resource actuators is encompassed by the global level of resource actuators; and identifying a plurality of resource actuators as a local level of resource actuators being included in a local level of the hierarchically identified cooling microgrids, wherein the local level of resource actuators is encompassed by the zonal level of resource actuators.

5. The method according to claim 1, wherein using the processor to determine settings for the plurality of resource actuators further comprises:

detecting a location where a change in the distribution of cooling resources is needed; and determining which at least one of the plurality of resource actuators is positioned to be manipulated to meet the change while maximizing the coefficient of performance of the distributed cooling resources.

6. The method according to claim 1, wherein the at least one measure of performance comprises a thermoeconomic measure of performance and wherein using the processor to determine settings for the plurality of resource actuators further comprises using the processor to minimize a total cost of ownership while maximizing utilization of available energy.

7. The method according to claim 1, further comprising:
determining a cost of maintaining conditions at the plurality of locations within predetermined ranges associated with manipulation of at least two resource actuators from different levels of the hierarchically identified cooling microgrids; and determining manipulation of which of the at least two resource actuators minimizes a total cost of ownership while maximizing utilization of available energy.

8. The method according to claim 1, further comprising:
using the processor to temporally mine the received conditions to identify one or more events of interest; and wherein using the processor to determine settings for the plurality of resource actuators further comprises using the processor to determine settings for the plurality of resource actuators in response to identification of one or more events of interest.

9. The method according to claim 1, wherein using the processor to determine the settings for the plurality of resource actuators in each level of the hierarchically identified cooling microgrids further comprises:

calculating the at least one measure of performance associated with supplying the cooling resources to the plurality of locations with the plurality of resource actuators at a plurality of resource actuator settings;

determining which of the plurality of resource actuator settings results in the optimized at least one measure of performance; and selecting resource actuator settings that result in the optimized at least one measure of performance as settings for the plurality of resource actuators.

10. A system for distributing cooling resources to a plurality of locations using a plurality of hierarchically identified cooling microgrids that comprise levels, each level of the hierarchically identified cooling microgrids comprising a plurality of resource actuators configured to vary distribution of the cooling resources, said system comprising:

one or more modules configured to receive conditions detected at the plurality of locations, said one or more modules also being configured to determine settings for the plurality of resource actuators in each level of the hierarchically identified cooling microgrids that maintain conditions at the plurality of locations within predetermined ranges, and configured to identify the plurality of resource actuators as being included in one or more microgrids, wherein the one or more modules are configured to determine the settings for the plurality of resource actuators based upon the one or more microgrids into which the plurality of resource actuators are identified as being included;

the one or more modules to optimize at least one measure of performance associated with supplying distributed cooling resources to the plurality of locations while maintaining the conditions within the predetermined ranges, based on manipulation of the resource actuators across levels of the hierarchically identified cooling microgrids;

the manipulation performed to determine a plurality of measures of performance, and identifying an optimized measure of performance and associated settings for the plurality of resource actuators;

wherein the at least one measure of performance comprises a coefficient of performance of the distributed cooling resources; and wherein the one or more modules are further configured to determine settings for the plurality of resource actuators to maximize the coefficient of performance of the distributed cooling resources; and a processor for implementing the one or more modules.

11. The system according to claim 10, wherein said one or more modules are further configured to identify, in each level of the hierarchically identified cooling microgrids, the plurality of resource actuators as being included in one or more microgrids.

12. The system according to claim 10, wherein the one or more modules are further configured to identify the microgrids as being included in one or more levels of the plurality of hierarchically identified cooling microgrids.

13. The system according to claim 10, wherein the one or more modules are further configured to detect a location where a change in the distribution of cooling resources is needed; and wherein the processor is further configured to determine which at least one of the plurality of resource actuators is positioned to be manipulated to meet the change while maximizing the coefficient of performance of the distributed cooling resources.

14. The system according to claim 10, wherein the at least one measure of performance comprises a thermoeconomic measure of performance; and wherein the one or more modules are further configured to determine settings for the plurality of resource actuators to minimize a total cost of ownership while maximizing utilization of available energy.

15. The system according to claim 10 wherein the one or more modules are further configured to temporally mine the received conditions to identify one or more events of interest and to determine settings for the plurality of resource actuators in response to identification of one or more events of interest.

16. A non-transitory computer readable storage medium on which is embedded one or more computer programs, said one or more computer programs implementing a method distributing cooling resources to a plurality of locations using a plurality of hierarchically identified cooling microgrids that comprise levels, each level of the hierarchically identified cooling microgrids comprising a plurality of resource actuators configured to vary distribution of the cooling resources, said one or more computer programs comprising a set of instructions for:

receiving conditions detected at the plurality of locations; and using a processor to determine settings for the plurality of resource actuators in each level of the hierarchically identified cooling microgrids that maintain conditions at the plurality of locations within predetermined ranges;

identifying the plurality of resource actuators as being included in one or more microgrids, wherein the processor is configured to determine the settings for the plurality of resource actuators based upon the one or more microgrids into which the plurality of resource actuators are identified as being included; and optimizing at least one measure of performance associated with supplying distributed cooling resources to the plurality of locations while maintaining the conditions within the predetermined ranges, based on manipulation of the resource actuators across levels of the hierarchically identified cooling microgrids;

the manipulation to determine a plurality of measures of performance, and identifying an optimized measure of performance and associated settings for the plurality of resource actuators;

wherein the at least one measure of performance comprises a coefficient of performance of the distributed cooling resources and wherein using the processor to determine settings for the plurality of resource actuators further comprises using the processor to determine settings to maximize the coefficient of performance of the distributed cooling resources.

17. The computer readable storage medium according to claim 16, said one or more computer programs further comprising a set of instructions for: in each level of the hierarchically identified cooling microgrids, identifying the plurality of resource actuators as being included in one or more microgrids.

18. The computer readable storage medium according to claim 17, said one or more computer programs further comprising a set of instructions for:

using the processor to temporally mine the received conditions to identify one or more events of interest; and wherein using the processor to determine settings for the plurality of resource actuators further comprises using the processor to determine settings for the plurality of resource actuators in response to identification of one or more events of interest.

* * * * *

UNITED STATES PATENT AND TRADEMARK OFFICE
CERTIFICATE OF CORRECTION

| | |
|---|---|
| PATENT NO. | : 8,352,085 B2 |
| APPLICATION NO. | : 12/770186 |
| DATED | : January 8, 2013 |
| INVENTOR(S) | : Manish Marwah et al. |

It is certified that error appears in the above-identified patent and that said Letters Patent is hereby corrected as shown below:

On the title page, item (73), Assignee, in column 1, line 2, delete "Company" and insert
-- Company, --, therefor.

Signed and Sealed this
Fourteenth Day of May, 2013

Teresa Stanek Rea
*Acting Director of the United States Patent and Trademark Office*